US011415824B2

(12) United States Patent
Dambach et al.

(10) Patent No.: US 11,415,824 B2
(45) Date of Patent: Aug. 16, 2022

(54) DISPLAY TILE WITH INCREASED DISPLAY AREA

(71) Applicant: BARCO N.V., Kortrijk (BE)

(72) Inventors: Soeren Dambach, Weingarten (DE); Nico Michael Naas, Karlsruhe (DE)

(73) Assignee: Barco N.V., Kortrijk (BE)

( * ) Notice: Subject to any disclaimer, the term of this patent is extended or adjusted under 35 U.S.C. 154(b) by 123 days.

(21) Appl. No.: 16/758,544

(22) PCT Filed: Oct. 23, 2018

(86) PCT No.: PCT/EP2018/078993
§ 371 (c)(1),
(2) Date: Apr. 23, 2020

(87) PCT Pub. No.: WO2019/081484
PCT Pub. Date: May 2, 2019

(65) Prior Publication Data
US 2020/0348555 A1 Nov. 5, 2020

(30) Foreign Application Priority Data

Oct. 24, 2017 (EP) .................................... 17198023
Mar. 16, 2018 (EP) .................................... 18162406

(51) Int. Cl.
G02F 1/1333 (2006.01)
H05K 7/14 (2006.01)
(52) U.S. Cl.
CPC .... *G02F 1/133308* (2013.01); *G02F 1/13336* (2013.01); *H05K 7/14* (2013.01); *G02F 1/133328* (2021.01)

(58) Field of Classification Search
CPC ........... G02F 1/133308; G02F 1/13336; G02F 1/133328; G02F 2201/54; H05K 7/14
See application file for complete search history.

(56) References Cited

U.S. PATENT DOCUMENTS

2015/0138484 A1    5/2015  Watanabe et al.

FOREIGN PATENT DOCUMENTS

| TW | 201610949 A   | 3/2016 |
| TW | M578394 U     | 5/2019 |
| WO | 2016041907 A1 | 3/2016 |

OTHER PUBLICATIONS

International Preliminary Report on Patentability in corresponding PCT/EP2018/078993 dated May 7, 2020.

(Continued)

*Primary Examiner* — Robert J Hoffberg
*Assistant Examiner* — Hung Q Dang
(74) *Attorney, Agent, or Firm* — Hamre, Schumann, Mueller & Larson, P.C.

(57) ABSTRACT

A frame for a display tile made of a first material with a first coefficient of thermal expansion and fastened to a first substrate made of a second material with a second coefficient of thermal expansion. The frame is divided into three parts: a first part to be glued by the adhesive to a lateral side of the substrate, a third part to serve as fastening interface to another structure and a second part to isolate the third part from strain in the first part. Grooves are formed in the second part, the grooves being substantially straight and substantially parallel to the first substrate, the frame having at least one opening made in one of the grooves etched in the metal frame to locally adjust the bending stiffness of the metal frame.

21 Claims, 13 Drawing Sheets

(56) References Cited

OTHER PUBLICATIONS

International Search Report in corresponding PCT/EP2018/078993 dated Jan. 25, 2019.
Extended Search Report in corresponding European application EP 18162406.5 dated Jun. 25, 2018.
Office Action issued in corresponding Indian application No. 202017017409, dated Mar. 11, 2022, with English translation.
Taiwanese OA in corresponding patent application dated May 11, 2022 and relevancy provided herewith.

Table 1

| Without perforation | With perforation |
|---|---|
| $I_0 = b_1 h_1^3 / 12$ | $I_0 = b_2 h_2^3 / 12$ |
| With $h1 > h_{min}$ | With $b_2 < b_1$ ; $h_2 > h_1$ |
| $\Delta I_0 / I_0 = 3 \Delta h / h_1$ | $\Delta I_0 / I_0 = 3 \Delta h / h_2$ |

Figure 10

DISPLAY TILE WITH INCREASED DISPLAY AREA

The present invention relates to a frame for a display tile, the frame being made of a first material with a first coefficient of thermal expansion and being fastened to a first substrate made of a second material with a second coefficient of thermal expansion by means of an adhesive.

BACKGROUND ART

A frame for a display or display tile, a display or display tile itself, or a method of constructing such a frame for a display or display tile is described in "Display Tile with Increased Display Area" published under PCT publication number WO2016/041907.

According to WO2016/041907, a display tile comprises a frame made of a first material with a first coefficient of thermal expansion is fastened to a substrate made of a second material with a second coefficient of thermal expansion by means of an adhesive like e.g. glue or adhesive tape . . . . The frame is characterized in that it is divided into three parts: a first part to be glued to a lateral side of the substrate, a third part to serve as fastening interface to another structure like e.g. a backlight element or a support structure and a second part positioned between the first and third part to isolate the third part from strain in the first part e.g. as strain relief.

Isolating the third part of the frame strip from strain in the first part of the frame strip can be assured by one or more openings in the frame strip. The opening extends across the first and second part of the frame strip away from the substrate. The frame, the frame strips and the first, second and third part of the frame strips are illustrated on FIGS. 1A and 1B.

FIG. 1A shows an exploded view with the substrate 1, frame strips 2A, 2B . . . that form the frame 2 for fastening the substrate 1 to e.g. a backlight structure (not shown).

Each of the frame strips 2A, 2B that form the frame 2 has openings 5, and can be glued by means of e.g. adhesive tape 3A, 3B to a lateral side 1A, 1B of the substrate 1.

FIG. 1B shows the three regions 21, 22 and 23 of a frame strip like 2A.

The openings can for instance be rectangular. The corners of the rectangle can be rounded.

Alternatively, the third part of the (frame) strip is preferably isolated from strain in the first part of the frame strip by grooves 6 formed, for example by etching or stamping in the frame part or by any equivalent method. An example of such grooves 6 is given on FIG. 2.

As seen on FIG. 3, the frame 2 may have to accommodate a mismatch M between the substrate 1 and a second substrate 7.

To avoid exerting stress on the adhesive layer 3 e.g. adhesive tape 3A, 3B, that binds the metal frame or frame strip 2 to the lateral sides of the substrate 1, it may be necessary to locally reduce the stiffness of the frame strip 2.

By reducing the stiffness of the frame, the grooves reduce the second moment of area of the plate when a bending torque with a direction parallel to the groves is applied to the frame strip. As seen on FIG. 2, this is advantageous when there is a mismatch M between the lateral side of a substrate and the lateral side of a structure to which the substrate is fastened by means of the frame.

Machining a material and in particular a plate to increase its flexibility (i.e. decrease its bending stiffness) is known in the art.

For instance, it is known that sawing indentations or kerfs in a wooden beam will reduce the torque needed to bend the wooden beam. The depth of the cuts (and the resulting modification of the second moment of area) can be tightly controlled.

Alternatively, grooves can be etched in the frame strips. Etching is known in the art to remove material in a controlled way to form or modify mechanical parts.

For instance, as described by Kurt Petersen in "Silicon as a mechanical material" on pp 420-457 of the Proceedings of the IEEE (Volume: 70, Issue: 5, May 1982), it is known that anisotropic etching with KOH (potassium hydroxide) can be used to selectively remove a semiconducting material like e.g. silicon and realize a micromechanical structure like e.g. simple beams. The thickness of the etched material can be controlled with high precision by means of a biased pn junction implanted in the semiconducting material and used as electrochemical "etch stop".

The electrochemical "etch stop" cannot be used with metals like steel or aluminum and the amount of material being etched is determined by timing. Timing the etching process is not very precise and the thinner the metal becomes, the higher the variation or tolerance on the thickness of the remaining metal. It is therefore difficult to determine the second moment of area in the second region of the frame with great precision using an etching technique to decrease bending moment.

A solution is needed and the art must be improved.

Definitions

Flexural rigidity. The resistance offered by a structure while undergoing bending. For a thin rectangular plate of thickness H, Young's modulus E and Poisson's ratio v; the flexural rigidity D is given by:

$$D = \frac{EH^3}{12(1-v^2)}$$

Kerf: a slit or notch made by a saw or cutting torch. The width of cut made by e.g. a saw or cutting torch.

Etch: to produce designs or figures on metal or glass by using a corrosive agent like e.g. an acid to eat into the surface.

Second moment of area.

The second moment of area l of a beam of width b and thickness h is approximated by:

$$l = b\ h^3/12.$$

SUMMARY OF THE INVENTION

It is a purpose of the invention to provide a frame for a display tile, the frame being made of a first material with a first coefficient of thermal expansion and being fastened to a first substrate made of a second material with a second coefficient of thermal expansion by means of an adhesive; the frame being divided into three parts: a first part to be glued by means of the adhesive to a lateral side of the substrate, a third part to serve as fastening interface to another structure and a second part positioned between the first and third part to isolate the third part from strain in the first part, grooves being formed in the second part of the frame, the grooves being substantially straight and substantially parallel to the first substrate, the frame being characterized that first material is removed in one of the grooves to locally adjust the bending stiffness of the metal frame.

The removed material can be perforations in the first material or reduced thickness of first material or at least one opening in the one of the grooves or any combination of these. The at least one opening can be made by any suitable subtractive machining process such as laser cutting, stamping or punching or drilling. The at least one opening can be completely surrounded by the first material. The thickness of the first material in the groove can be reduced by subtractive machining such as by chemical machining, etching or laser ablation or grinding or milling of the metal frame.

It is an advantage of this aspect of the invention that it increases the flexibility of the metal frame and helps preventing excessive stress on the adhesive used to assemble the metal frame and the first substrate.

In a further aspect sets of two or more openings are made in the second part of the frame for isolating a third part of the frame from strain in the first part of the frame. The two or more openings can be made in a part of the frame where the first material has a reduced thickness. The two or more openings can each be completely surrounded by the first material.

It is an advantage of that aspect of the invention that it improves the isolation of the third part of the metal frame from strain in the first part of the metal frame.

In a further aspect of the invention two or more sets of two or more openings are provided, whereby the openings of a set are aligned with each other and two or more sets of two or more openings are preferably located parallel to each other.

In another aspect of the invention, a display tile supported by a frame has electrical contacts positioned along the lateral side of the first substrate at places that correspond to one or more openings in the frame.

Embodiments of the present invention provide a method of making a frame for a display tile, comprising the steps: making the frame with a first material with a first coefficient of thermal expansion fastened to a first substrate made of a second material with a second coefficient of thermal expansion by means of an adhesive;
dividing the frame into three parts: a first part glued by means of the adhesive to a lateral side of the first substrate, a third part to serve as fastening interface to another structure and a second part positioned between the first and third part to isolate the third part from strain in the first part, wherein grooves are formed in the second part of the frame), the grooves being substantially straight and substantially parallel to the first substrate, wherein the first material is removed in one of the grooves to reduce the thickness of the first material in the one of the grooves and to perforate the first material in the one of the grooves to locally adjust the bending stiffness of the metal frame.

The perforations can be formed as one opening formed in the reduced thickness of the first material in the one of the grooves. The reduced thickness of the first material can be formed by etching in the metal frame Sets of two or more openings can be made in the second part of the frame for isolating a third part of the frame from strain in the first part of the frame. Two sets of two or more openings can be provided, whereby the openings of a set are aligned with each other and two or more sets of two or more openings are preferably formed parallel to each other.

Electrical contacts of the display tile can be positioned at places along the lateral side of the first substrate that correspond to one or more openings in the frame.

The at least one opening can be made by subtractive machining process. For example, the subtractive machining can be any of laser cutting, stamping or punching or drilling.

The at least one opening can be formed completely surrounded by the first material. The thickness of the first material in the groove can be reduced by subtractive machining. The subtractive machining can comprise any of chemical machining, etching or laser ablation or grinding or milling of the metal frame.

Other aspects of the invention, product or process, are described with reference to any one of the Examples of embodiments or to any one of the accompanying drawings.

BRIEF DESCRIPTION OF THE FIGURES

FIG. 10 illustrate how the flexibility of a hinge in a metal strip according to an embodiment of the present invention will vary in function of the tolerances affecting the depth of a groove etched in the frame strip and openings in the frame strip.

DETAILED DESCRIPTION OF THE INVENTION

Figure 4:
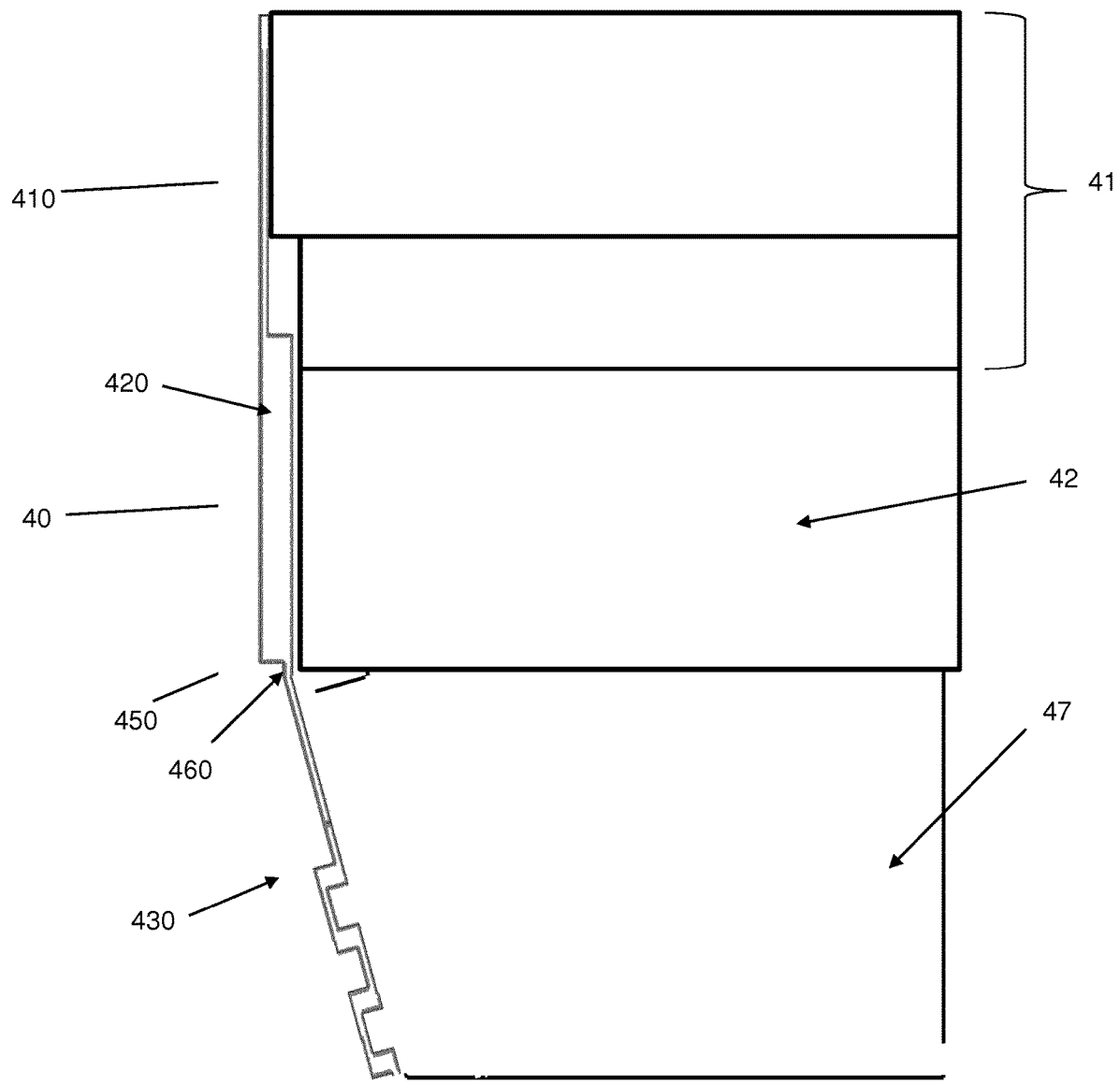
FIG. 4 shows a cross section of the metal frame and the substrate it is fastened to for assembly to a backlight unit according to an embodiment of the present invention.

FIG. 4 shows a cross section of a display tile according to an embodiment of the present invention. FIG. 4 shows a cross section of a metal frame and a substrate to which it is fastened for assembly to a backlight unit according to an embodiment of the present invention.

A frame strip 40 is fastened to a substrate such as a liquid crystal panel 41 and a backlight unit 47. The strip 40 is fastened to a lateral side the panel 41 with an adhesive layer (not shown). The strip 40 is also fastened to a lateral side of the backlight unit 47 e.g. with an adhesive layer (not shown). A diffusing substrate such as a borosilicate glass substrate 42 can be used as diffuser for the light exiting the backlight unit 47. The frame strip 40 has the three parts or regions known from the art: a first part 410 to be glued to a lateral side of a substrate like e.g. a liquid crystal display panel 41, a third part 430 to serve as fastening interface to another structure like e.g. the backlight unit 47. A compliant means such as a hinge formed by a change in thickness 450 is introduced in the second part 420 of the strip 40 to allow isolation of the third part 430 from strain. The second part 420 is positioned between the first and third parts and provides compliant means as strain relief for the first part. This strain relief is achieved in part by the change in thickness of the strip 40 shown at least as 450 forming at least a "hinge" 460. The "hinge" 460 is a region of the frame strip 40 that is flexible enough to accommodate mismatches. The first part 410 of the frame strip 40 can comprise several narrow extrusions or tongues like 510 in FIG. 8 (not shown in FIG. 4). The local reduction of thickness 450 in hinge 460 is equivalent to decreasing the width of such a tongue and thereby decreases the second moment of area in a well-controlled fashion. Holes can be made in the second part 420 of FIG. 4 as shown in FIGS. 9 (522a and 522b) to reduce stiffness further.

Figure 5:
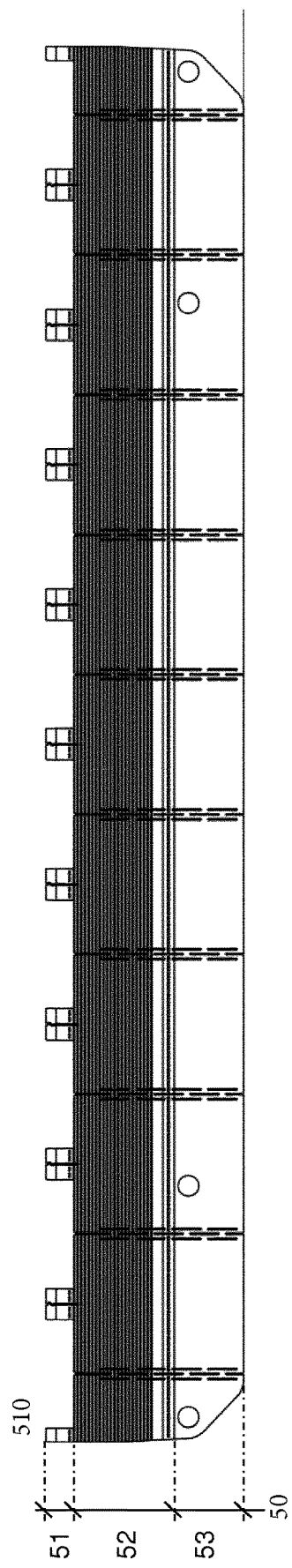
FIG. 5 shows a metal frame strip according to an embodiment of the present invention.

FIG. 5 shows an example of a frame strip according to an embodiment of the invention.

The frame strip 50 has the three parts or regions known from the art: a first part 51 to be glued to a lateral side of a substrate like e.g. a liquid crystal display, a third part 53 to serve as fastening interface to another structure like e.g. a backlight element or a support structure and a second part 52 positioned between the first and third part to isolate the third part from strain in the first part e.g. as strain relief.

Figure 6:
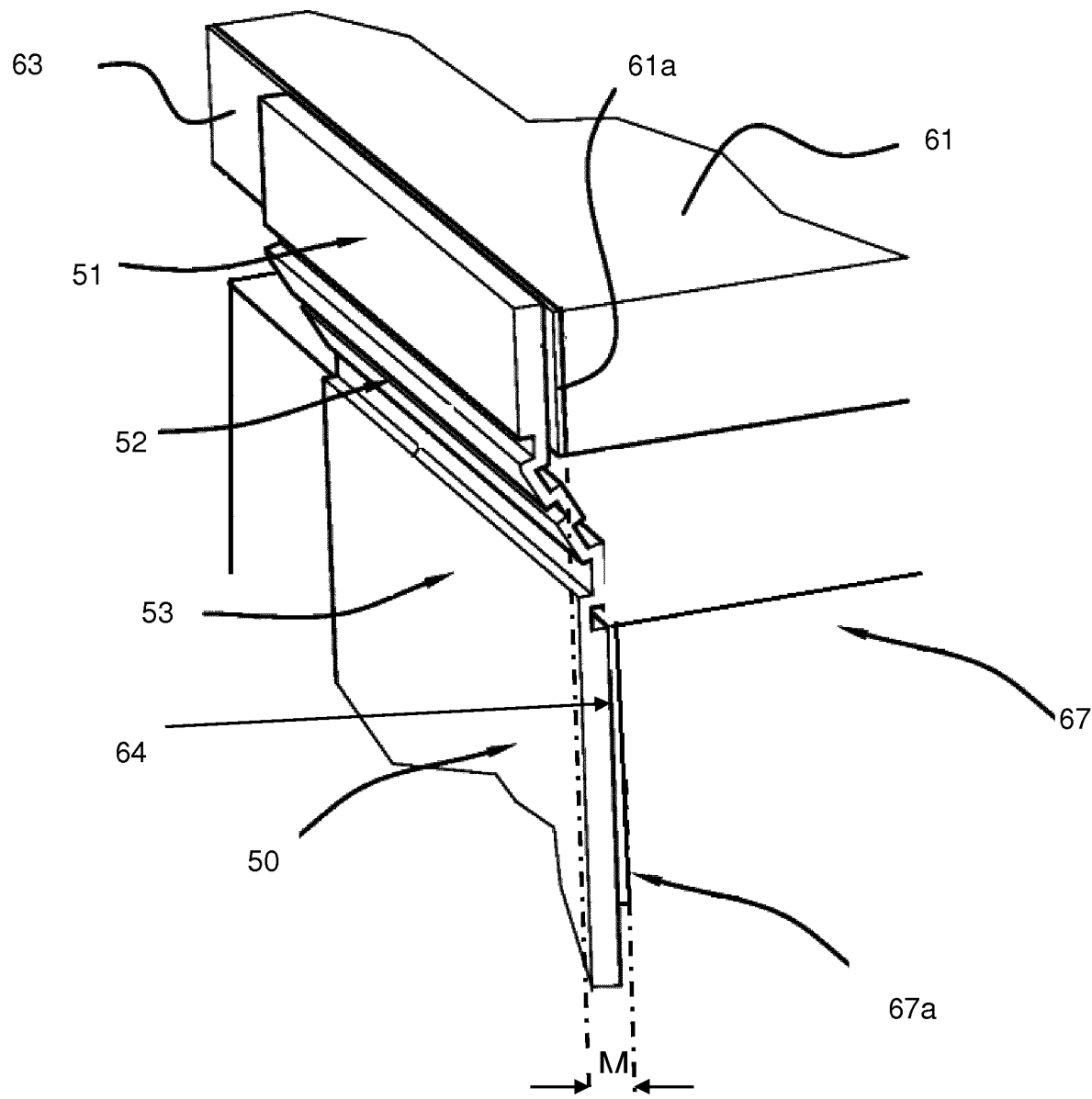
FIG. 6 shows a perspective view of a metal frame strip and the mismatch M between the first part of the frame strip and the third part of the frame strip when the side walls of the substrate and the sidewalls of the backlight unit to which it is fastened are not co-planar according to an embodiment of the present invention.

FIG. 6 shows a perspective view of the frame strip 50 fastened to a liquid crystal panel 61 and a backlight unit 67. The strip 50 is fastened to a lateral side 61a of the panel 61 with an adhesive layer 63. The strip 50 is also fastened to a lateral side 67a of the backlight unit 67 with an adhesive layer 64.

A compliant means such as grooves are introduced in the second part 52 of the strip 50 to allow the first part 51 and third part 53 to be positioned in different planes. For example, compliance can be introduced by grooves or corrugations in the second part 52 of the strip 50 that allow the first part 51 and third part 53 to be positioned in different planes. In FIG. 6, the planes in which the first and third parts of the strip are, are parallel to each other and separated by a distance or mismatch M.

Figure 7:
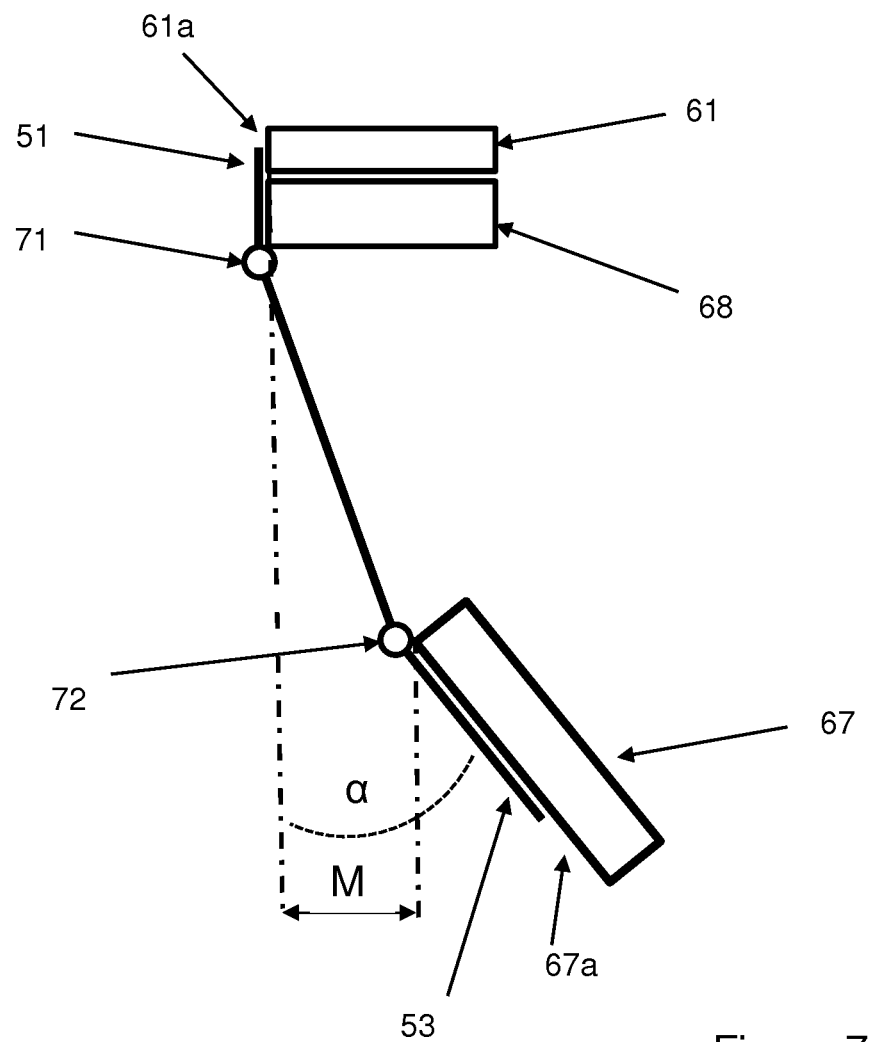
FIG. 7 shows a schematic cross section of the situation when the sidewalls of the substrate and the sidewalls of the backlight unit are neither co-planar nor parallel according to an embodiment of the present invention.

As seen on FIG. 7, the planes in which the first part 51 and third part 53 of the frame strip 50 are positioned, are not necessarily parallel to each other. This can e.g. be the case if the lateral walls of the backlight unit 67 form an angle α with the plane containing the sidewall 61a of the liquid crystal panel 61 to which the first part 51 of the frame strip 50 is glued. FIG. 7 also shows an intermediate glass plate 68 between the liquid crystal panel 61 and the backlight unit 67.

The "hinges" 71 and 72 are regions of the frame strip that are flexible enough to accommodate the mismatch M and the angle α between the sidewalls 61a of the substrate 61 and 67a of the backlight unit 67. If the hinges 71 and 72 are too stiff, this may induce stress on the binding means like e.g. glue that holds the frame strip 50 and the sidewalls 61a, 67a together.

The hinges 71 and 72 can be realized by e.g. chemical machining such as etching grooves in the frame strip 50 or forming corrugations in the frame strip 50.

Etching metal is not a very precise process.

For instance, the frame strip can be realized in a metal sheet with a thickness of 250 μm. The grooves can be etched to a depth of preferably 180 μm, thereby reducing the thickness of the metal sheet to 70 μm at the bottom of a groove. This may result in hinges 71 and 72 that are still too stiff for the long term reliability of the assembly (in particular when the sheet of metal is made of e.g. austenitic stainless steel like e.g. AISI301 used for forming wrought products).

The variability or tolerance of the etching process can be as high as 30 μm. This means that if the nominal thickness of the metal sheet is 70 μm at the bottom of a groove, the actual thickness may be as low as 40 μm and as high as 100 μm.

To evaluate the impact that the variability or tolerance on the thickness of the plate at the bottom of a groove has on the stiffness of the hinges 71 and 72, let us look at the second moment of area of a plate with the same thickness as the frame strip 50 at the bottom of a groove. The second moment of area and the flexural rigidity of a plate with a thickness h is proportional to $h^3$ (the cube of the thickness). If h can vary from 40 μm to 100 μm, the second moment of area and the flexural rigidity will vary by a factor>15 (i.e. the cube of the ratio 100/40).

If the grooves are etched deeper in the metal plate to further reduce the stiffness of the frame at the hinges 71 and 72, the variability or tolerance on the flexural rigidity will be even higher. Furthermore, reducing the thickness of the frame strip too much may compromise its integrity and reduce its ability to bear the load of the liquid crystal panel 61.

In an embodiment of the present invention, the second moment of area and flexural rigidity of the frame strip is locally decreased by means of subtractive machining such as by laser ablation, grinding, milling, laser cutting, drilling or punching or stamping perforations such as holes or openings in the frame strip. These can be made in sections of the frame strip that have been reduced in thickness.

Figure 8:
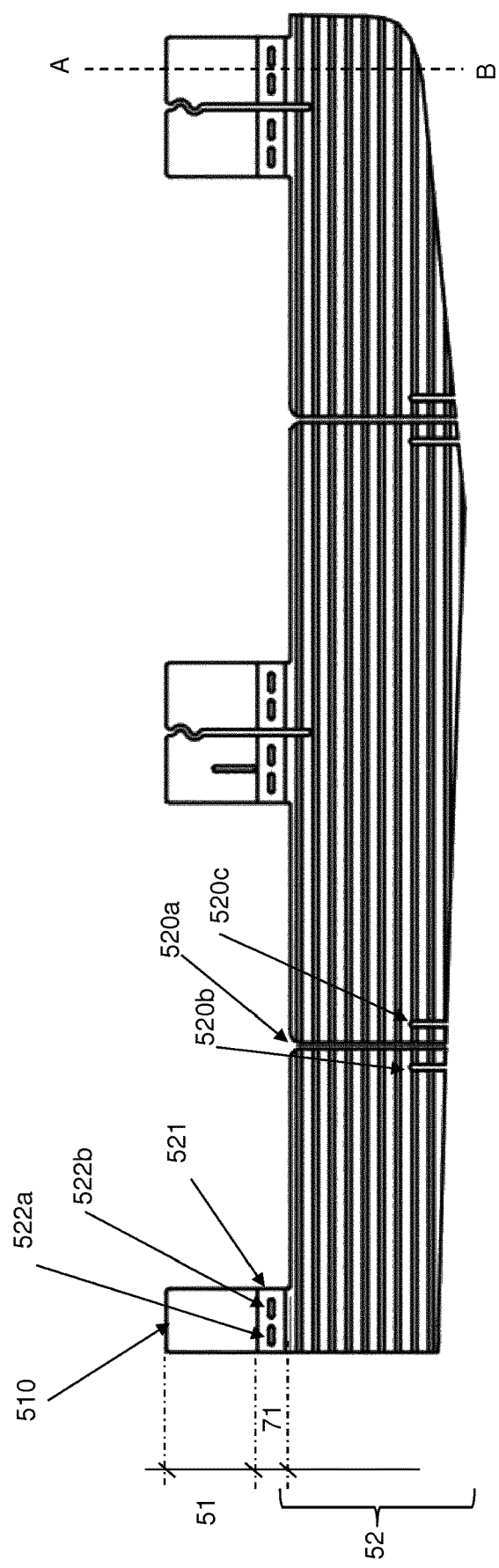
FIG. 8 shows details of a frame strip according to an embodiment of the present invention.
Figure 9:
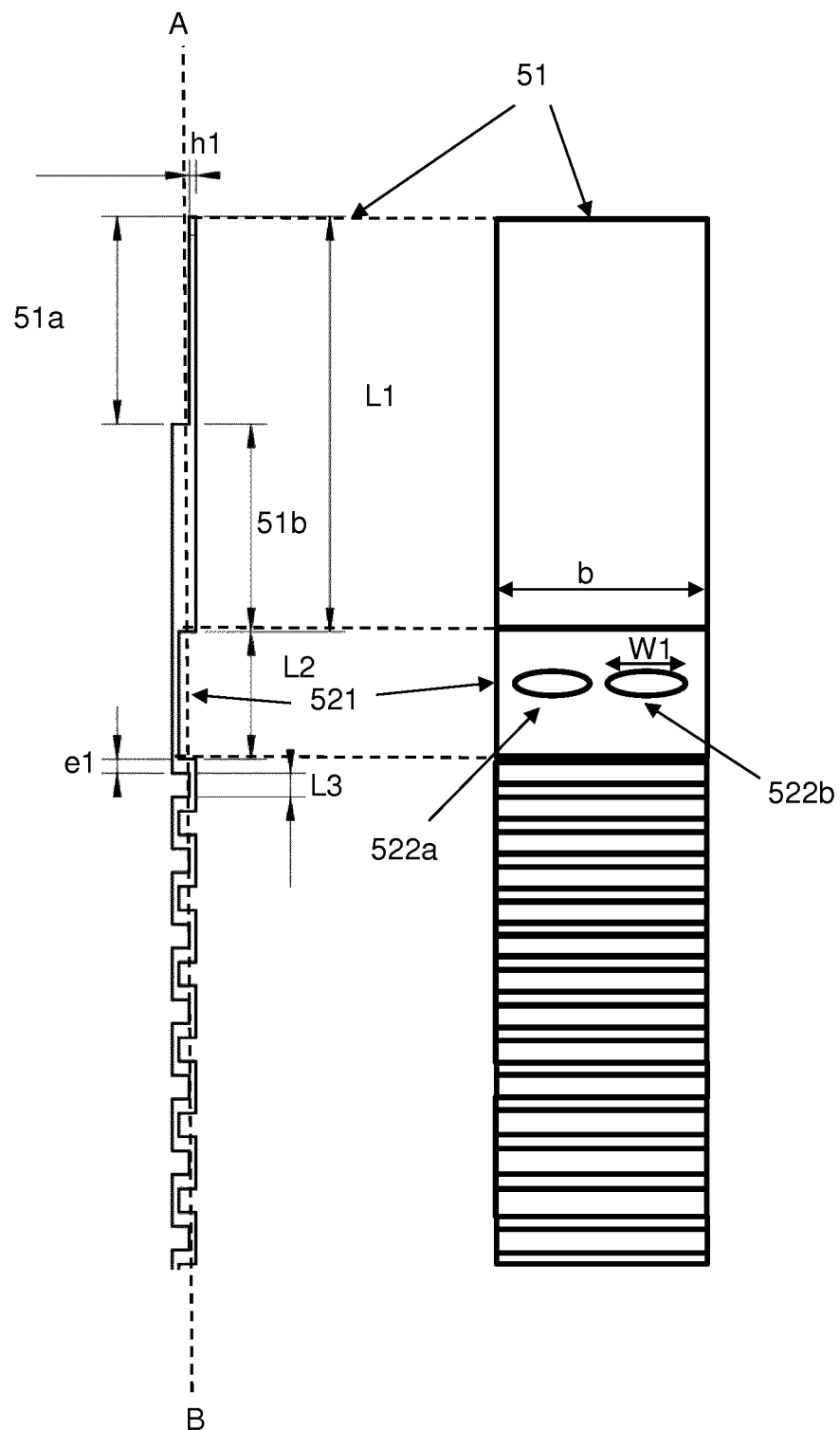
FIG. 9 shows a cross section of the frame strip in the vicinity of a hinge according to an embodiment of the present invention.

This is illustrated in FIGS. 8 and 9 which give details of the hinges 71.

The hinges 71 are positioned close to the border between the first part 51 and the second part 52 of a frame strip 50. The hinges 71 can be entirely in the first part 51, entirely in the second part 52 or overlap the first part 51 and the second part 52.

In the example of FIG. 8, the flexure rigidity of the plate is locally reduced by forming e.g. punching or stamping two holes 522a and 522b. The holes can for instance be formed, stamped or punched at the bottom of a large groove 521.

The lateral dimensions of the holes 522a and 522b can be better controlled than the thickness of the metal plate at the bottom of the etched groove 521.

For instance, the groove 521 can be 1.35 mm wide and the metal plate at the bottom of the groove 521 can be 100 μm thick.

FIG. 9 shows a cross section of the frame strip along the axis AB on FIG. 8.

The first part 51 of the frame strip 50 can comprise several narrow extrusions or tongues like 510 in FIG. 8. The second moment of area of a tongue can be approximated by the second moment of area for a beam. As is well known, the second moment of area of a beam is $b \times h^3/12$ where b is the width of the beam and h the thickness of the beam.

In a first approximation, removing material in the groove 521 is equivalent to decreasing the width b of the tongue 510 and thereby decreasing the second moment of area in a well-controlled fashion. If, as in FIG. 9, the openings 522a and 522b have a width W1, the total width of the beam falls to b−2 W1 and the second moment of area becomes approximately:

$$I=(b-2W1)h^3/12$$

It is thus possible to compensate for the limitation of an etching process when one combines it with a subtractive manufacturing process such as a hole making process, for example a punching or stamping process, a laser cutting process or a drilling process.

The etching process can be used to decrease the thickness of the frame strip 50 (in particular in the vicinity of the mechanical tongue 510) while subtractive manufacturing process such as a hole making process, for example the punching or stamping process, a laser cutting process, or a drilling process is used to decrease the effective width of the mechanical tongue 510 (i.e. the width which contributes to the bending stiffness).

The etching process is stopped before the thickness reach a minimum threshold th1 below which the variability or tolerance affecting the thickness would be higher than desirable.

Openings are then formed the subtractive manufacturing process such as a perforation or hole making process, for example a laser cutting process or a drilling process or a punching or stamping process to further reduce the second moment of area in a more controlled fashion.

The advantages of the technique are summarized in Table 1 on FIG. 10.

In the example of FIG. 9, the metal of the tongue 510 is etched to a nominal thickness of e.g. 70 μm over a nominal length of 1.35 mm.

As seen on FIG. 10, one can achieve a desired nominal second moment of area $I_0$ by reducing the thickness of the plate to a first thickness h1 and a first width b1 with large variations of the second moment of area caused by the tolerances on the thickness (with Δh/h1=r1). h1 must be higher than a minimum h min to avoid etching away the entire thickness of metal because of the etching process variations (i.e. if the tolerance of the etching process is 30 μm, h min will be larger than 30 μm, for instance 50 μm or 70 μm).

One can also achieve the same desired nominal second moment of area $I_0$ by reducing the thickness of the plate to a second thickness h2>h1 and a second width b2<b1 with smaller variations of the second moment of area caused by the tolerances on the thickness (with Δh/h2=r2<r1). Indeed, the relative variation $\Delta I_0/I_0$ of the second moment of inertia when h varies can be approximated by 3 Δh/h. The higher h will be, the lower Δh/h will be.

The variability or tolerance over b being a lot better than over h, they will hardly affect $I_0$.

The same technique can be used to adjust the stiffness of the hinge 72 of the frame strip.

In another aspect of the invention, a specific pattern is adopted for the openings that are made across the second part 52 of the frame strip 50.

Figure 1A:
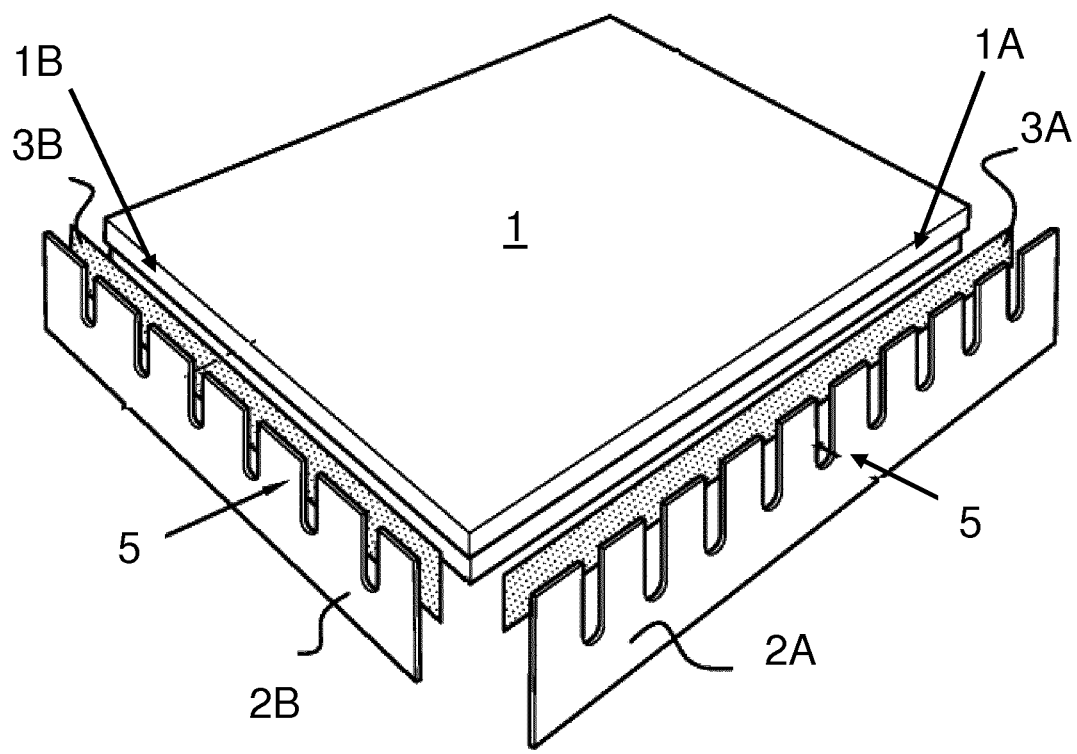
FIG. 1A shows an exploded view of a metal frame and the substrate it supports according to the art.
Figure 1B:
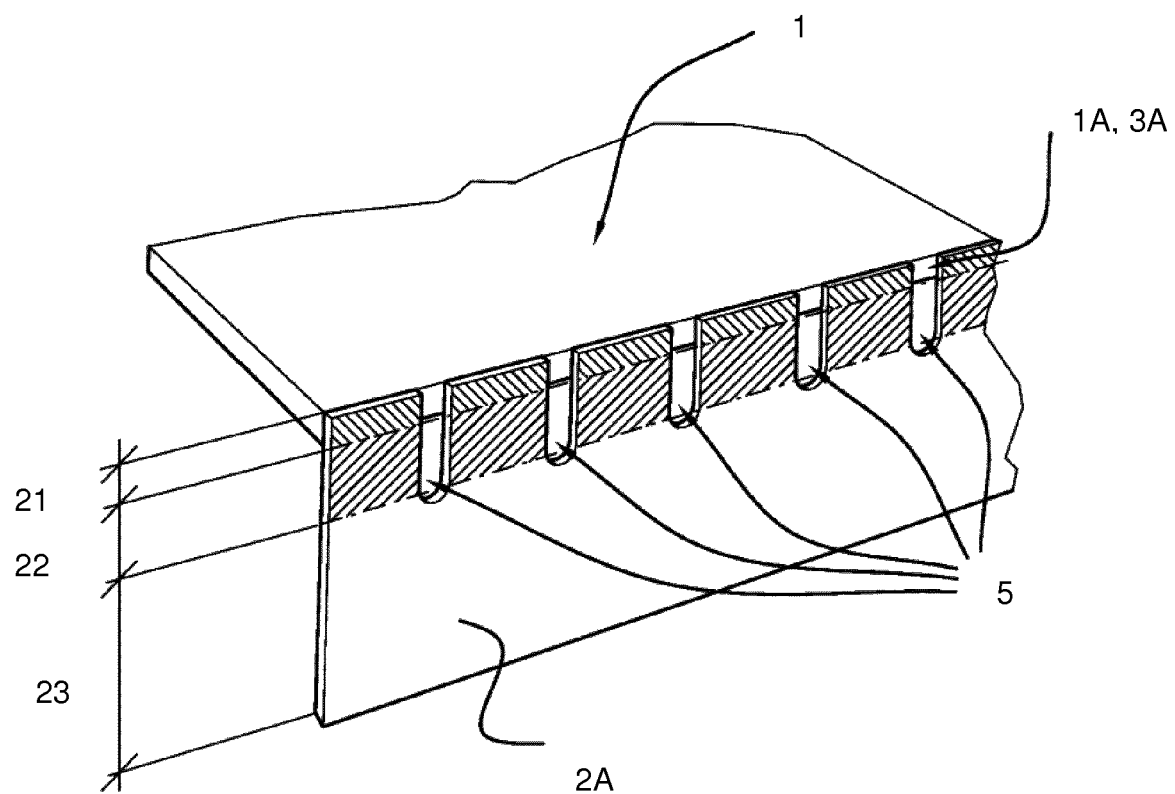
FIG. 1B shows the parts of a frame strip.
Figure 2:
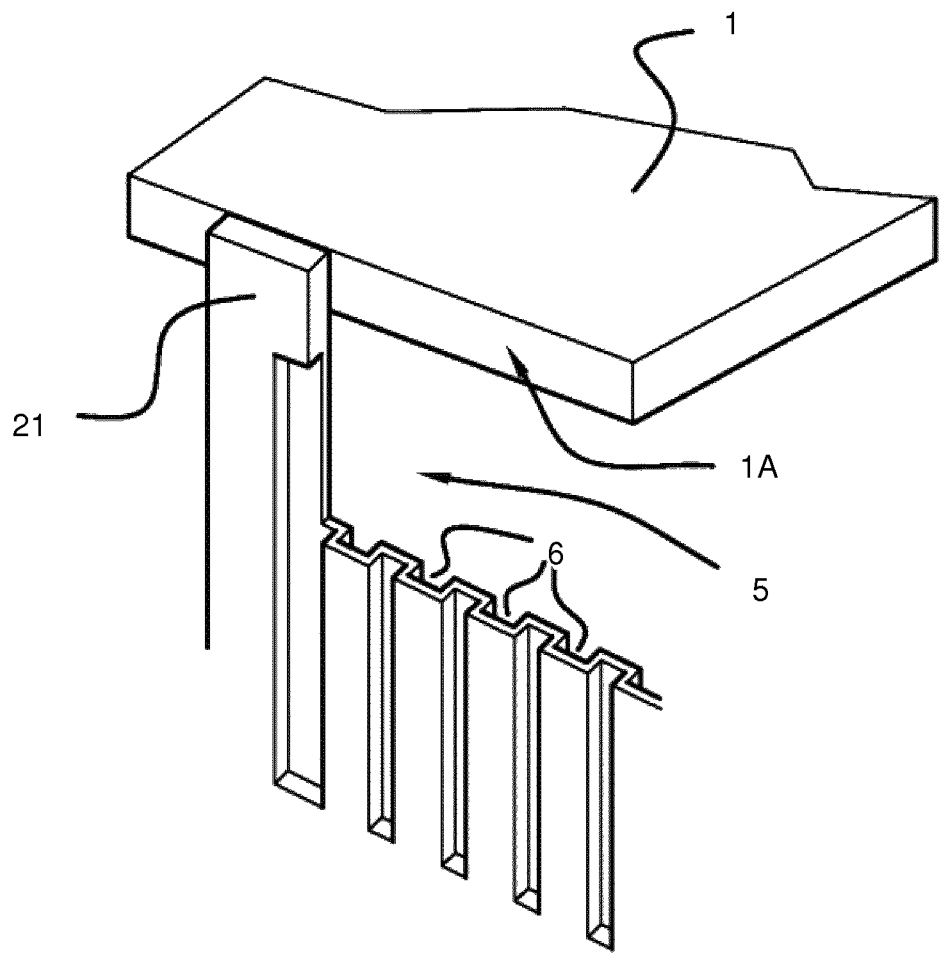
FIG. 2 shows a combination of opening and grooves that isolate the third part of a frame strip from the strain in a first part of the frame strip.
Figure 3:
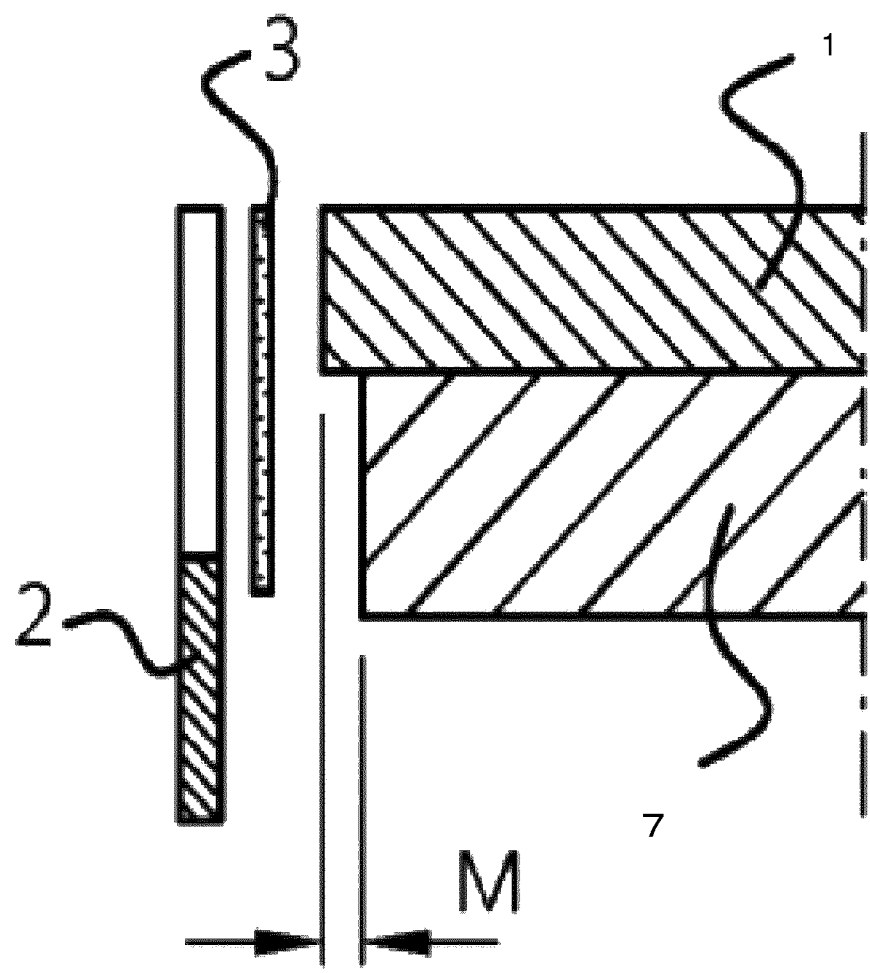
FIG. 3 shows a cross section of a metal frame according to the art when an mismatch M exist between the lateral sides of substrates glued to the metal frame strip 2 by means of e.g. an adhesive tape 3.

As described in the art, isolating the third part 53 of the frame strip 50 from strain in the first part 51 of the frame strip can be assured by one or more openings in the frame strip. The openings can for instance be rectangular. The corners of the rectangle can be rounded. The openings can be used in combination with corrugations as illustrated on FIG. 2.

Figure 11:
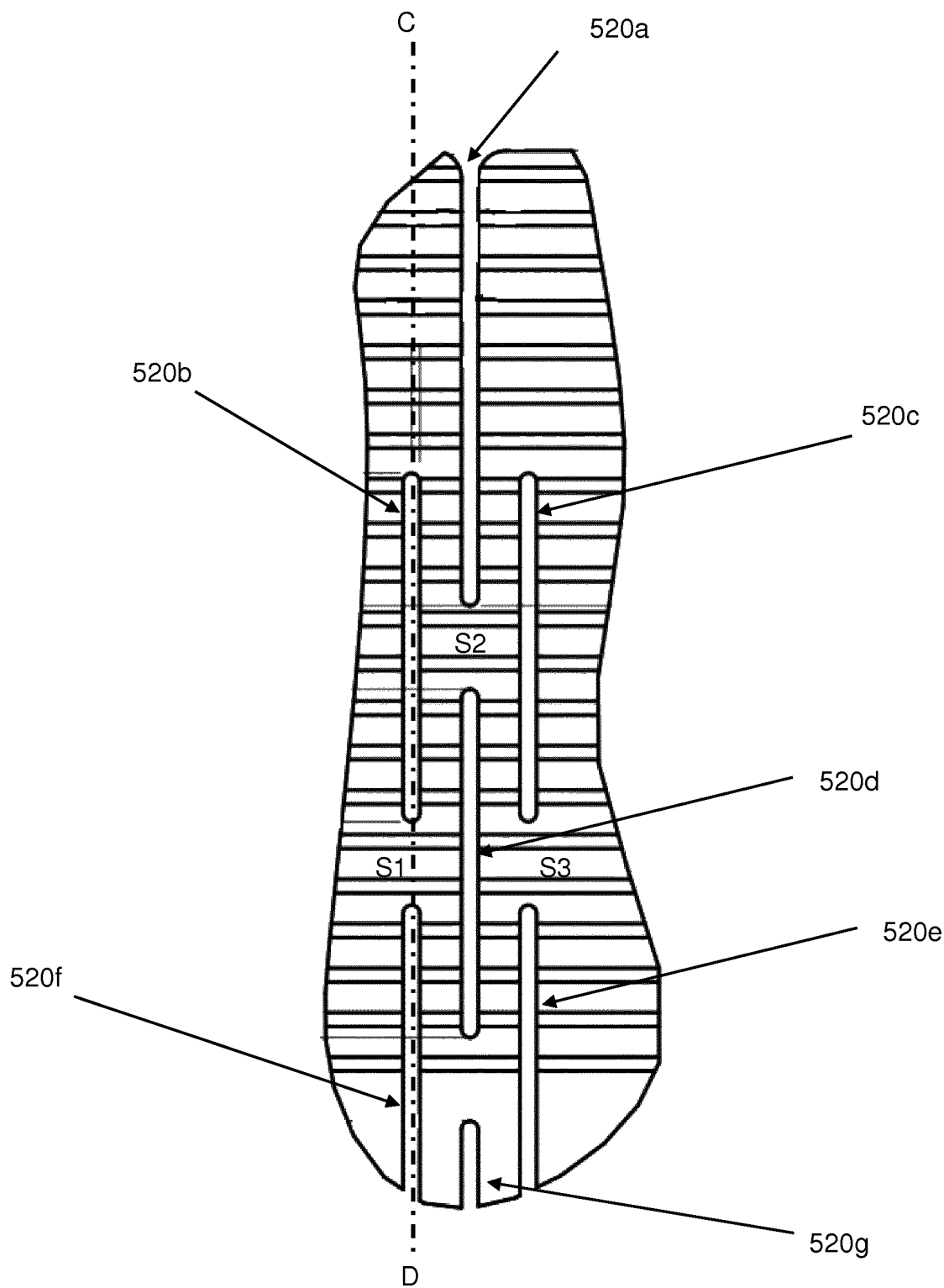
FIG. 11 shows a pattern of openings according to an embodiment of the present invention that can improve the isolation of the third part of the metal frame from strain in the first part of the metal strain.

FIG. 11 shows an embodiment of a combination of openings to improve the performance of the metal frame.

The same pattern can be repeated between successive metal "tongues" 510 as seen on the example of FIG. 5.

An example of pattern consists of three sets of openings: {520b, 520f, . . . }, {520a, 520d, 520g . . . }, {520c, 520e, . . . }. Each opening has a first dimension of width and a second dimension of length. The length of an opening is preferably at least five times its width. In another embodiment, the length of an opening is preferably at least ten times its width. In another embodiment, the length of an opening is preferably at least twenty times its width. The openings can be identical in shape and dimensions as on FIGS. 5 and 11. The distance between two successive openings in a set is less than the length of the openings. The distance between two successive openings can be the same for the three sets of openings.

The openings can be parallel to each other. The openings of a set are aligned. As seen on FIGS. 5 and 11, the openings 520b, 520f are on the same straight line CD. Similarly, the openings 520a, 520d, 520g are aligned along a straight line parallel to CD and the openings 520c, 520e . . . are aligned along yet another straight line parallel to CD.

As seen on FIGS. 5 and 11, the three sets of openings are shifted i.e. the spaces (like e.g. 51, S2 and S3 on FIG. 11) between two consecutive openings do not face each other.

The openings in the first part 51 of the frame strip 50 can be used to contact the liquid crystal display without increasing the width of the seam. This is illustrated on FIG. 12.

Figure 12:
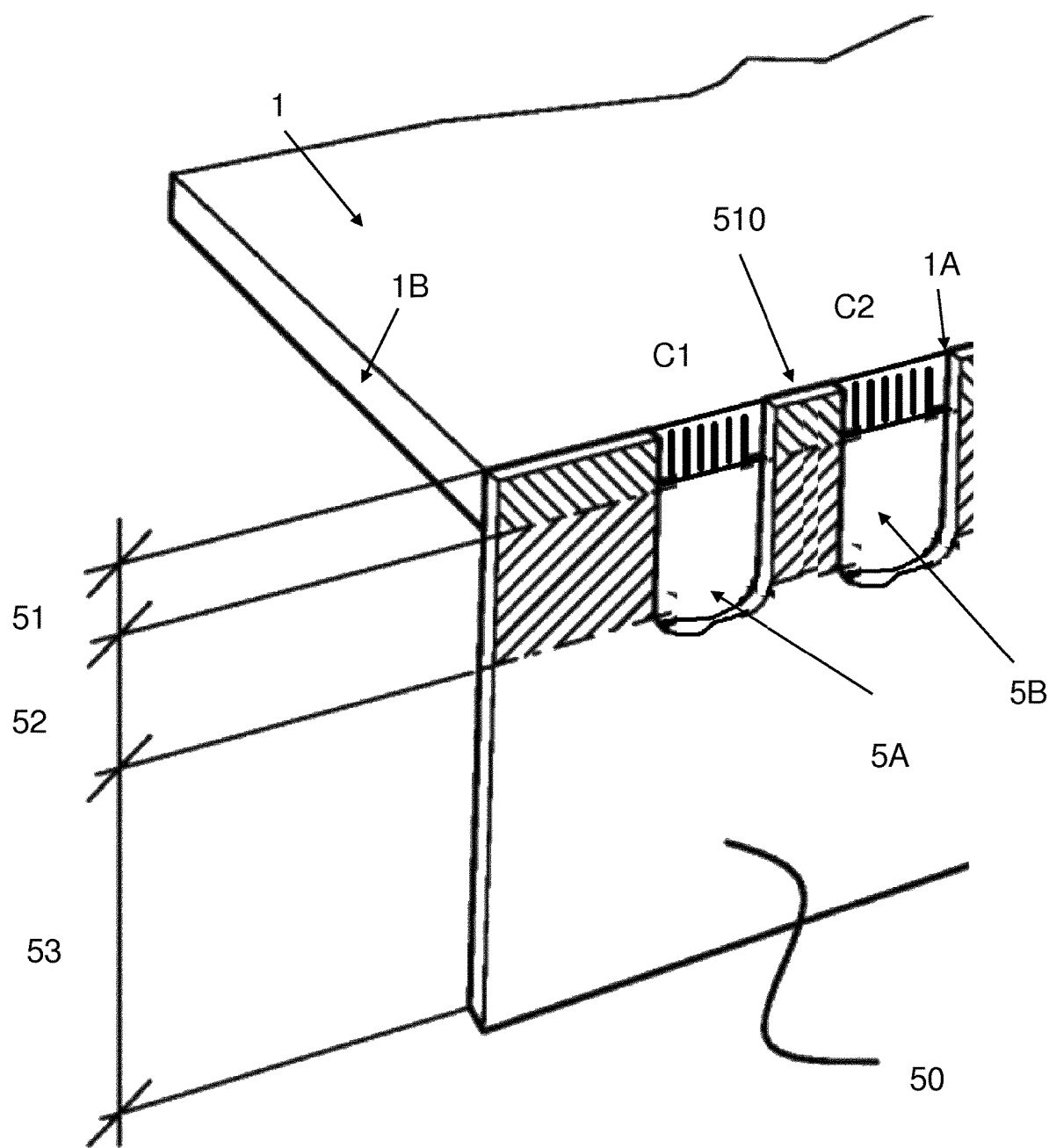
FIG. 12 shows openings in a first part of a frame strip that can be used to contact a liquid crystal display without increasing the width of the seam according to an embodiment of the present invention.

As it is visible on FIG. 12, if the space between two successive tongues 510 is not large enough to accommodate all the contacts required to operate the liquid crystal panel, these contacts can be split into two or more groups, each group being positioned between two successive tongues. A first group of contacts C1 is positioned on a lateral side 1A of the liquid crystal panel 1 in a first opening 5A and a second group of contacts C2 is positioned on a lateral side 1A of the liquid crystal panel 1 in a second opening 5B.

In the particular case of FIG. 12, the contacts are divided into two groups positioned in two successive openings 5. The flexible connector for electrical connection of the contacts to a driving electronics can be e.g. Y-shaped. By being positioned in openings like 5A and 5B, the flexible connector need not be positioned between the lateral side 1A of the LC panel 1 and the metal frame, thereby reducing the non-display area around the liquid crystal panel 1.

In another aspect of the invention, a shape is adopted for the openings that are made across the second part 52 of the frame strip 50 to reduce strain or stress concentration.

The invention claimed is:

1. A frame for a display tile, the frame comprising:
a first material with a first coefficient of thermal expansion and being fastened to a first substrate made of a second material with a second coefficient of thermal expansion by means of an adhesive;
the frame being divided into three parts: a first part to be glued by means of the adhesive to a lateral side of the first substrate, a third part to serve as fastening interface to another structure and a second part positioned between the first and third part to isolate the third part from strain in the first part,
wherein grooves are formed in the second part of the frame, the grooves being substantially straight and substantially parallel to the first substrate, wherein the first material of the frame is removed in one of the grooves to reduce the thickness of the first material in the one of the grooves and to perforate the first material in the one of the grooves to locally adjust the bending stiffness of the frame.

2. The frame for a display tile according to claim 1, wherein the perforations are at least one opening formed in the reduced thickness of the first material in the one of the grooves.

3. The frame for a display tile according to claim 1, wherein the at least one opening is completely surrounded by the first material.

4. The frame for a display tile according to claim 1, wherein the reduced thickness of the first material is formed by etching in the frame.

5. The frame for a display tile according to claim 1, wherein sets of two or more openings are made in the second part of the frame for isolating a third part of the frame from strain in the first part of the frame.

6. The frame for a display tile according to claim 5, wherein the two or more openings are located in a part of the frame where the first material has reduced thickness.

7. The frame for a display tile according to claim 5, wherein the two or more openings are completely surrounded by the first material.

8. The frame for a display tile according to claim 5, wherein two sets of two or more openings are parallel to each other.

9. A display tile supported by a frame according to claim 1, wherein electrical contacts of the display tile are positioned at places along the lateral side of the first substrate that corresponds to one or more openings in the frame.

10. A method of making a frame for a display tile, comprising the steps:
making the frame from a first material with a first coefficient of thermal expansion fastened to a first substrate made of a second material with a second coefficient of thermal expansion by means of an adhesive;
dividing the frame into three parts: a first part glued by means of the adhesive to a lateral side of the first substrate, a third part to serve as fastening interface to another structure; and a second part positioned between the first part and the third part to isolate the third part from strain in the first part,
wherein grooves are formed in the second part of the frame, the grooves being substantially straight and substantially parallel to the first substrate,
wherein the first material is removed in one of the grooves to reduce the thickness of the first material in the one of the grooves and to perforate the first material in the one of the grooves to locally adjust the bending stiffness of the frame.

11. The method of claim 10, comprising forming the perforations as one opening formed in the reduced thickness of the first material in the one of the grooves.

12. The method according to claim 10, wherein the at least one opening is completely surrounded by the first material.

13. The method according to claim 10, wherein the reduced thickness of the first material is formed by etching in the frame.

14. The method according to claim 10, wherein the two or more openings are located in a part of the frame where the first material has reduced thickness.

15. The method according to claim 10, wherein the two or more openings are completely surrounded by the first material.

16. The method according to claim 10, wherein sets of two or more openings are made in the second part of the frame for isolating a third part of the frame from strain in the first part of the frame.

17. The method according to claim 10, wherein two sets of two or more openings are formed parallel to each other.

18. The method according to claim 10, wherein electrical contacts of the display tile are positioned at places along the lateral side of the first substrate that corresponds to one or more openings in the frame.

19. The method according to claim 10, wherein the at least one opening is made by subtractive machining process, wherein the subtractive machining is optionally any of laser cutting, stamping or punching or drilling.

20. The method according to claim 10, wherein the at least one opening is completely surrounded by the first material.

21. The method according to claim 10, wherein the thickness of the first material in the groove is reduced by subtractive machining, wherein the subtractive machining optionally comprises any of chemical machining, etching or laser ablation or grinding or milling of the frame.

* * * * *